(12) United States Patent
Kossives et al.

(10) Patent No.: US 6,683,384 B1
(45) Date of Patent: *Jan. 27, 2004

(54) AIR ISOLATED CROSSOVERS

(75) Inventors: Dean Paul Kossives, Glen Gardner, NJ (US); Fan Ren, Warren, NJ (US); King Lien Tai, Berkeley Heights, NJ (US)

(73) Assignee: Agere Systems INC, Allentown, PA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 1013 days.

(21) Appl. No.: 08/946,693

(22) Filed: Oct. 8, 1997

(51) Int. Cl.$^7$ .......................... H01L 23/48; H01L 23/52; H01L 29/40; H01L 23/10
(52) U.S. Cl. ........................ 257/777; 257/707; 257/737; 257/778
(58) Field of Search ................................ 257/777, 778, 257/737, 707

(56) References Cited

U.S. PATENT DOCUMENTS

| | | | | |
|---|---|---|---|---|
| 4,710,798 A | * | 12/1987 | Marcantonio | 257/777 |
| 5,262,660 A | * | 11/1993 | Streit et al. | 257/194 |
| 5,376,584 A | * | 12/1994 | Agarwala | 257/737 |
| 5,381,039 A | * | 1/1995 | Morrison | 257/778 |
| 5,399,898 A | * | 3/1995 | Rostoker | 257/777 |
| 5,614,766 A | * | 3/1997 | Takasu et al. | 257/777 |
| 5,675,474 A | * | 10/1997 | Nagase et al. | 257/707 |
| 5,825,092 A | * | 10/1998 | Delgado et al. | 257/778 |
| 5,866,949 A | * | 2/1999 | Schueller | 257/778 |

* cited by examiner

*Primary Examiner*—Eddie Lee
*Assistant Examiner*—Jesse A. Fenty
(74) *Attorney, Agent, or Firm*—Peter V. D. Wilde

(57) ABSTRACT

The specification describes integrated circuit air isolated crossover interconnections designed for flip chip multi-chip module interconnection technology. The crossovers are made using a crossover interconnection substrate separate from the interconnection substrate of the integrated circuit. In one embodiment the integrated circuit is flip chip bonded to a multi-chip or multi-component interconnection substrate, and the crossover interconnections are made through solder bumps or balls soldered to a conductive layer on the crossover interconnection substrate. In another embodiment the crossover is made via a crossover substrate flip chip bonded to an integrated circuit mounted on a multi-chip or multi-component interconnection substrate.

10 Claims, 5 Drawing Sheets

AIR ISOLATED CROSSOVERS

FIELD OF THE INVENTION

This invention relates to the manufacture of integrated circuit, particularly power integrated circuits that employ air isolated crossovers bridging between contact sites.

BACKGROUND OF THE INVENTION

Air isolated crossovers are commonly used in integrated circuit technology particularly in specialized device applications like high power transistors and amplifiers. In circuits operating below 1 GHz the skin depth of metal interconnections is larger than 2.5 μm, and gold or gold alloy crossover bridges of suitable dimensions for these application are costly and difficult to manufacture with high yield.

STATEMENT OF THE INVENTION

We have developed an alternative to conventional air isolated crossovers that employs multi-chip module (MCM) technology. In this approach, less expensive metals such as aluminum can be used for interconnection. The MCM interconnections are more robust and better adapted for state of the art device packaging. In the MCM approach the transistor IC is flip chip bonded to the interconnection substrate and the air bridge is formed between the chip and the interconnection substrate. In an alternative arrangement a crossover interconnection substrate resembling an MCM chip is flip chip bonded to an integrated circuit mounted on a multi-chip or multi-component interconnection substrate. The term as "air isolated" used herein is a term of art meaning that a gap exists between the crossing conductor and another conductor. The gap may be air or may be filled with insulating filler material as is well known in the art.

The term "crossover" as known in the art means an interconnection between two or more contact sites on one substrate that crosses but does not connect to one or more other contact sites, and, as described herein, exclusively interconnects the aforesaid contact sites and nothing else.

DETAILED DESCRIPTION

Figure 1:
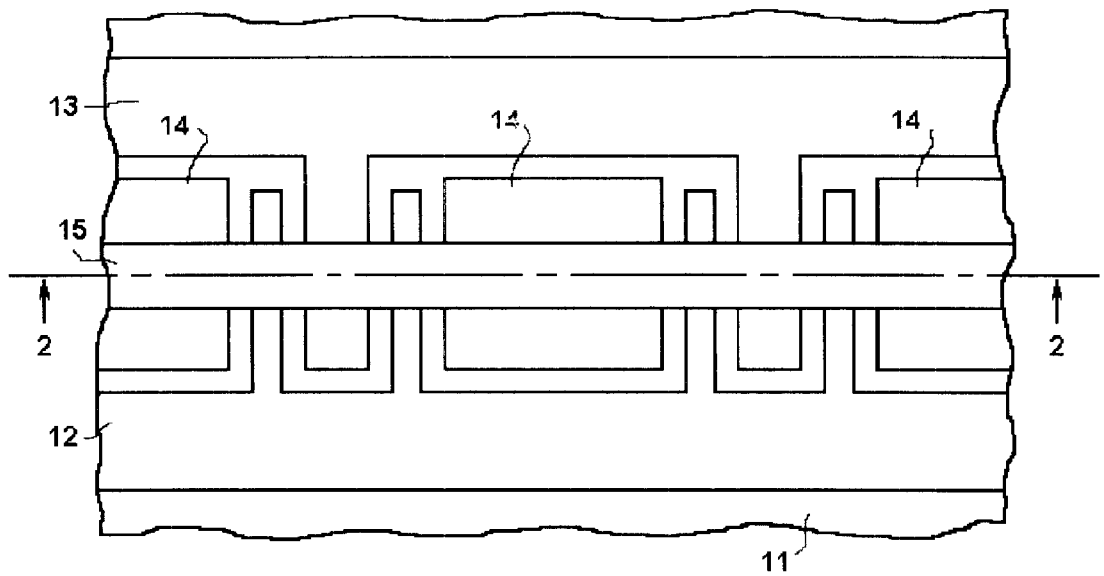
FIG. 1 is a cutaway plan view of a portion of a power transistor integrated circuit chip showing part of an array of transistors with drains interconnected with a conventional air isolated crossover.

Referring to FIG. 1 a portion of a semiconductor chip 11 is shown in plan view. A conventional metal runner for the gate interconnect runner is designated 12, and a conventional metal runner for the interdigitated multiple source regions is designated 13. The drains in this chip layout are isolated island regions, and the drain contacts 14 are interconnected by air isolated crossover 15. The metallization arrangement shown is but one option as will be appreciated by those skilled in the art. However, it is most convenient to use the air isolated crossover to connect to the largest circuit features, and large drain regions are preferable to large gate or source regions. Alternatively, adjacent transistors can be arranged with drain regions of adjacent transistors abutting, allowing e.g. a single contact window for two adjacent drains or a common drain. In that design, the crossovers must be extended from one device length to nearly two device lengths.

The air isolated crossover material may be selected from a variety of metals. Gold and gold alloy crossover beams are relatively robust and are used in GaAs technology. Air isolated crossovers must be relatively thick, both for strength and for conductivity, and thus add significant cost to the device.

Figure 2:
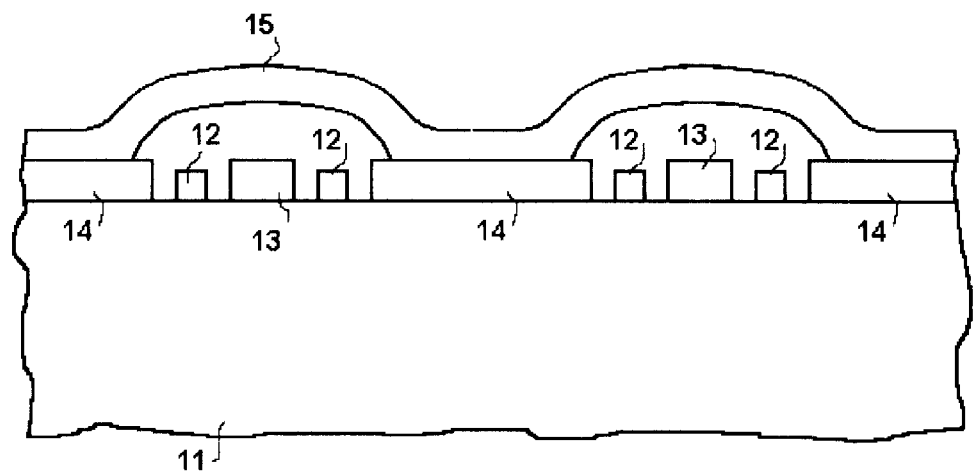
FIG. 2 is a section through 2—2 of FIG. 1.

The air isolated crossover of FIG. 1 can be viewed in more detail in the section 2—2 shown in FIG. 2. Here the substrate, source, gate and drain contacts are shown as 11, 12, 13 and 14 as in FIG. 1. For simplicity the device structure within the substrate itself, i.e. impurity regions etc., have been omitted. The relevant portion of the devices, in the context of the invention, are the metal contacts on the surface of the substrate. In GaAs transistor devices the usual contact metal is TiPdAu or TiPtAu although other metals can be used. The air isolated crossovers are shown at 15.

Techniques for making air isolated crossovers generally follow the approach of filling the space to be bridged with photoresist, or an equivalent, to serve as a temporary support, depositing the crossover metal bridge on the photoresist support, and dissolving away the photoresist leaving the metal bridge spanning the space filled by the photoresist. The process sequence can be appreciated from FIGS. 3–7.

Figure 3:
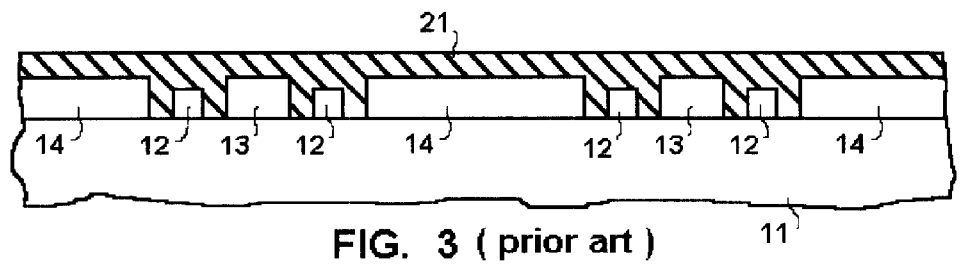
FIGS. 3–7 are schematic representations of the processing steps conventionally used for making the air isolated structure of FIGS. 1 and 2.
Figure 4:
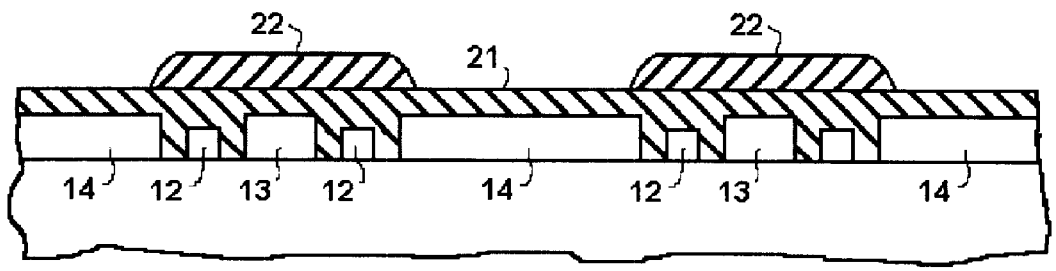
Figure 5:
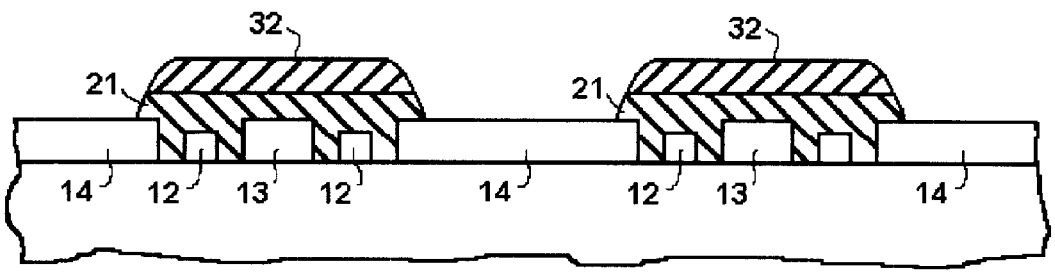

In FIG. 3, the substrate 11 is shown with the same array of surface contacts 12, 13, and 14 as in FIG. 2. The surface is coated with a polyimide layer 21 to planarize the surface as shown. Then a photoresist layer 22 is deposited and patterned by conventional means as shown in FIG. 4. Using the patterned layer 22 as a mask, the exposed regions of layer 21 are removed by etching in a standard $O_2$ plasma. During this step the photomask 22 is also removed. A second photoresist layer is applied and patterned to form the structure shown in FIG. 5. Regions of the drain contacts 14 to be interconnected are exposed at this point in the sequence.

Figure 6:
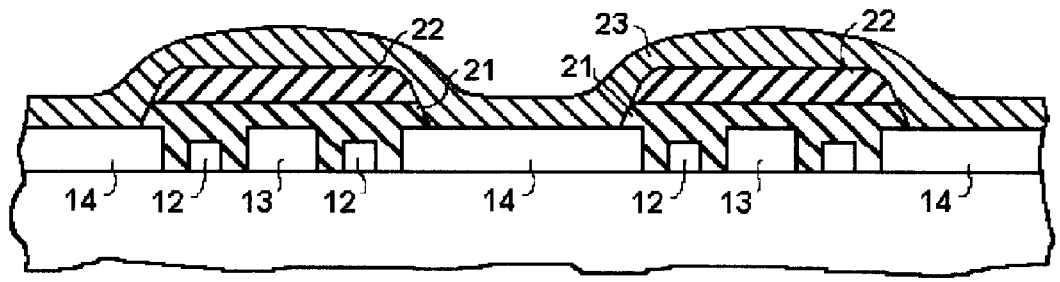
Figure 7:
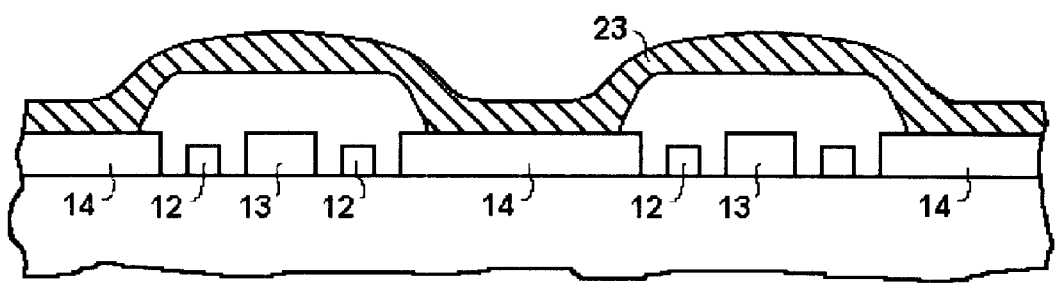

A thick metal layer 23 for the crossover bridges is deposited on the photoresist/polyimide layer as shown in FIG. 6. The metal layer is typically several microns thick to produce a self supporting span and reduce the resistance. The photoresist and polyimide layer is then dissolved away typically using acetone for the photoresist and methyly isobutyl ketone for the polyimide leaving the structure shown in FIG. 7, with the metal crossover 23 interconnecting the series of drain contacts 14 over air isolated regions as shown.

This air isolated crossover method is effective and widely used. However, the processing is cumbersome, the metal crossovers are typically thick gold beams and thus expensive, and the crossovers are fragile and are not well adapted for some state of the art packaging approaches, e.g. MCM packaging.

Figure 8:
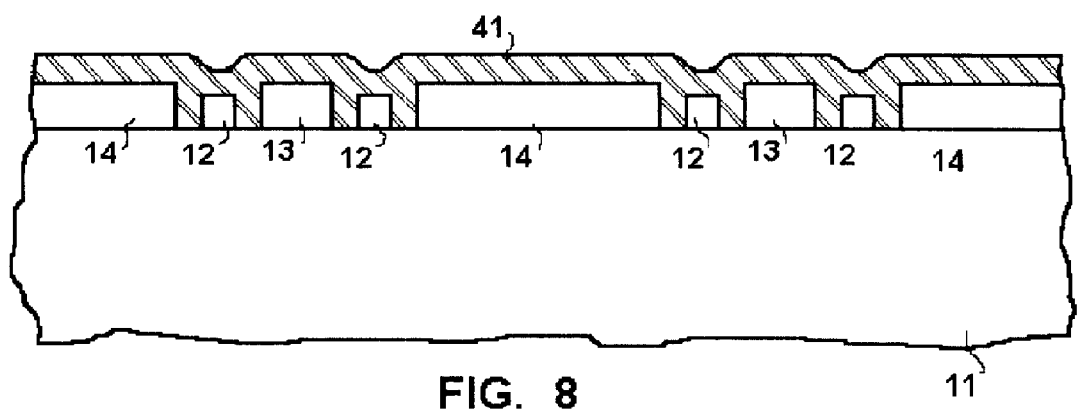
FIGS. 8–11 are schematic representations of the process steps used for the MCM interconnection as an alternative to conventional air isolated structures.
Figure 9:
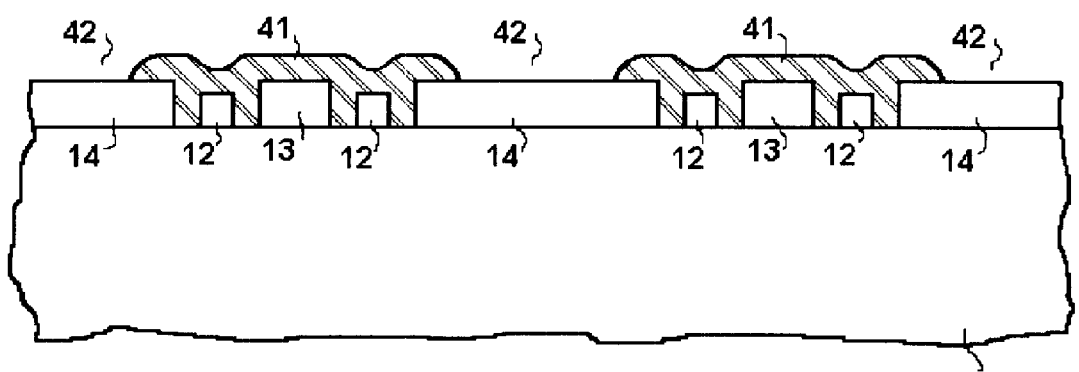
Figure 10:
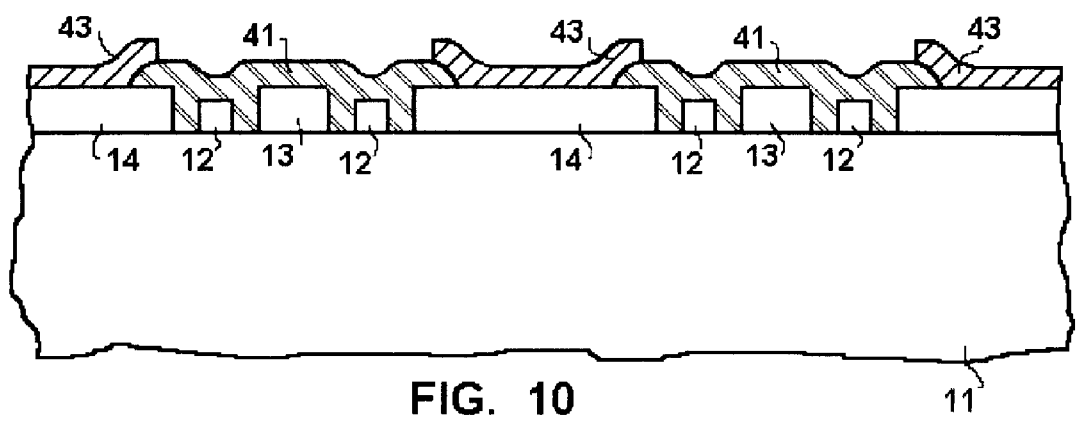

The alternative according to the invention will be described in conjunction with FIGS. 8–14. Referring to FIG. 8 the substrate 11 has the same metal contact features 12, 13 and 14 as previously shown. The layer 41 is $Si_3N_4$ commonly referred to as $SiN_x$ caps, or may be another IC capping material e.g. polyimide. This is the conventional integrated circuit structure after completion of wafer level processing and die separation. The next step, shown in FIG. 9, is to photolithographically pattern the capping layer (or layers) 41 to open drain contact windows 42. Conventional lithographic patterning is used. The chip is then prepared for flip chip bonding by applying under bump metallization (UBM) 43 in the contact windows as shown in FIG. 10. The metal or metals used for UBM must adhere well to the material of contact pads 14, must be wettable by typical tin solder formulations, and be highly conductive. A structure meeting these requirements is a composite of chromium and copper. Chromium is deposited first, to adhere to the contact pad, and copper is applied over the chromium to provide a solder wettable surface. Chromium is known to adhere well to a variety of materials, organic as well as inorganic. Accordingly it adheres well to dielectric materials, e.g. $SiO_2$, SINCAPS, polyimide, etc., commonly used in IC processing, as well as to metals such as copper and aluminum. However, solder alloys dissolve copper and de-wet from chromium. Therefore, a thin layer of copper directly on chromium will dissolve into the molten solder and then the solder will de-wet from the chromium layer. To insure interface integrity between the solder and the UBM, a composite or alloy layer of chromium and copper is typically used between the chromium and copper layers.

The aforementioned layers are conventionally sputtered, so several options for depositing them are conveniently available. The layer can be sputtered from an alloy target. It can be sputtered using a chromium target, then changing to a copper target. Or it can be sputtered using separate chromium and copper targets, and transitioning between the two. The latter option produces a layer with a graded composition, and is a preferred technique.

Figure 11:
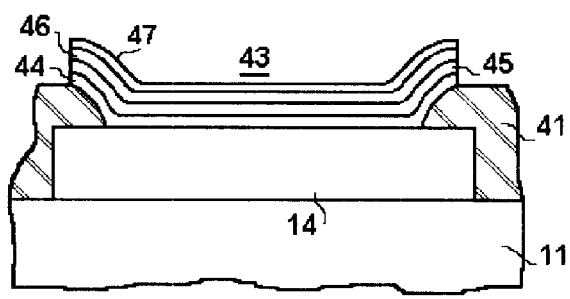

The multilayers for the UBM are deposited sequentially to form the composite layered structure shown in FIG. 11. (For simplicity, the detailed view of FIG. 11 shows a single contact site). In the typical process, the layers are sputtered in a sputtering apparatus containing both a chromium target and a copper target. Sputtering techniques are well known and the details are not necessary for this description. Other techniques for depositing the metal layers, e.g. evaporation, can also be used.

The under bump metallization that contacts drain contact 14 is shown generally at 43. It comprises a first layer 44 of chromium with a thickness of the order of 500–5000 Angstroms and preferably 1000–3000 Angstroms. Chromium adheres well to the contact 14 and also adheres to the dielectric layers present in the structure. It also is refractory and forms a corrosion resistant interface with the aluminum contact. The second layer 45 is a thin transition layer of Cr/Cu to provide a solder wettable and a metallurgically sound interface between the chromium layer and the subsequently formed copper layer. Layer 45 is preferably formed by sputtering in an apparatus with both chromium and copper targets, and transitioning between the targets. This results in a co-sputtered layer with a composition varying between pure chromium and pure copper. The thickness of the transition layer is of the order of 1000–5000 Angstroms, and preferably 2000–3000 Angstroms.

The next layer 46 is a copper layer with a thickness of the order of 1000–10000 Angstroms, and preferably 2000–6000 Angstroms. The copper layer 46 is wettable with solder materials commonly used for the solder bumps. The melting point of most tin based eutectic solders is relatively low, and at the soldering temperature the surface of the copper layer reacts with the solder bump forming a physically and electrically sound intermetallic bond. Even if all the copper is consumed by the solder layer the solder will still adhere and wet the Cr/Cu composite layer. Tin still can react with Cu in the composite but Cr will not, so that the reacted Cu—Sn intermetallic component is locked into the Cr/Cu composite structure.

FIG. 11 shows an optional layer 47 of gold that may be applied to the surface of the copper layer to inhibit oxidation of the copper surface. The optional gold layer has a thickness of 500–3000 Angstroms, and preferably 1000–2000 Angstroms.

Additional details for processing this multilevel under bump metallization system can be found in my co-pending patent application Serial No. (Degani Case 31 filed Apr. 2, 1997) which is incorporated herein by reference. While this metallization system is particularly effective for the interconnection process described, other alternatives known in the art, for example, Ti/Ni/Au, may also be used.

After completion of the multilayer UBM of FIG. 11, or an alternative contact metallization, the contact sites are then coated with solder. The solder coating is formed by any suitable technique such as evaporation. The thickness of a typical solder bump for this application is 10–20 mils. Examples of solder compositions that can be used successfully in the processes described here are:

|    | I  | II | III |
|----|----|----|-----|
| Sn | 5  | 63 | 95  |
| Pb | 95 | 37 | 0   |
| Sb | 0  | 0  | 5   |

Figure 12:
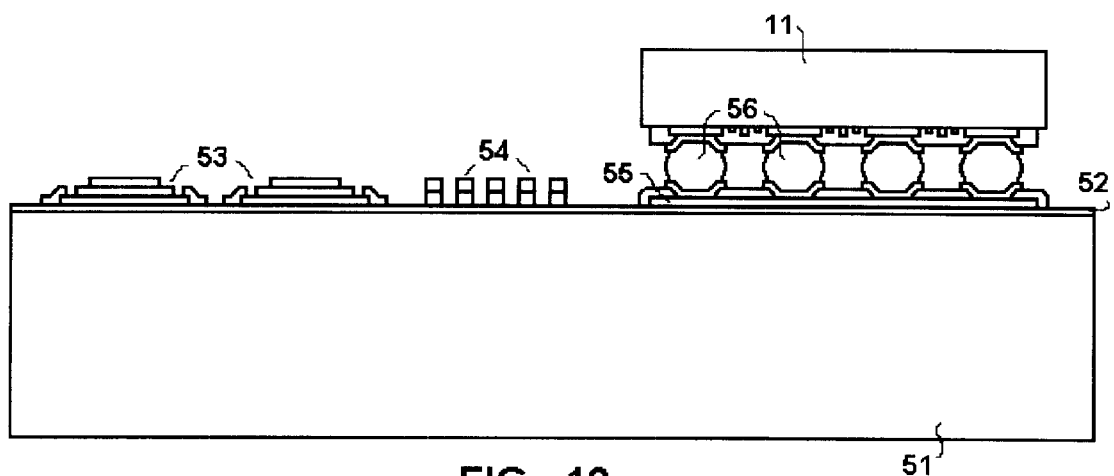
FIGS. 12–15 are schematic views of embodiments of the completed device structures according to the invention.

The substrate 11 of FIG. 10 with the solder bumps in place is then flip chip bonded to an interconnection substrate 51 as shown in FIG. 12. The bonding sites on the substrate can be prepared with under bump metallization in the same manner as the bonding sites on the substrate 11. The interconnection substrate may be one of a variety of printed circuit boards, e.g. epoxy glass, but is preferably silicon. In the embodiment shown here, silicon interconnection substrate 51 has an oxide layer 52 covering the interconnection substrate. The oxide is typically grown but can be deposited. The substrate may also have arrays of other devices, and shown here for illustration is an array 53 of tantalum capacitors, and an array 54 of aluminum inductors. These components are interconnected with the standard printed circuits on interconnection substrate 51. The crossover for the transistor devices on substrate 11 includes layer 55 on the interconnection substrate 51, which completes the electrical connection from each drain contact 14 through solder balls 56.

Figure 13:
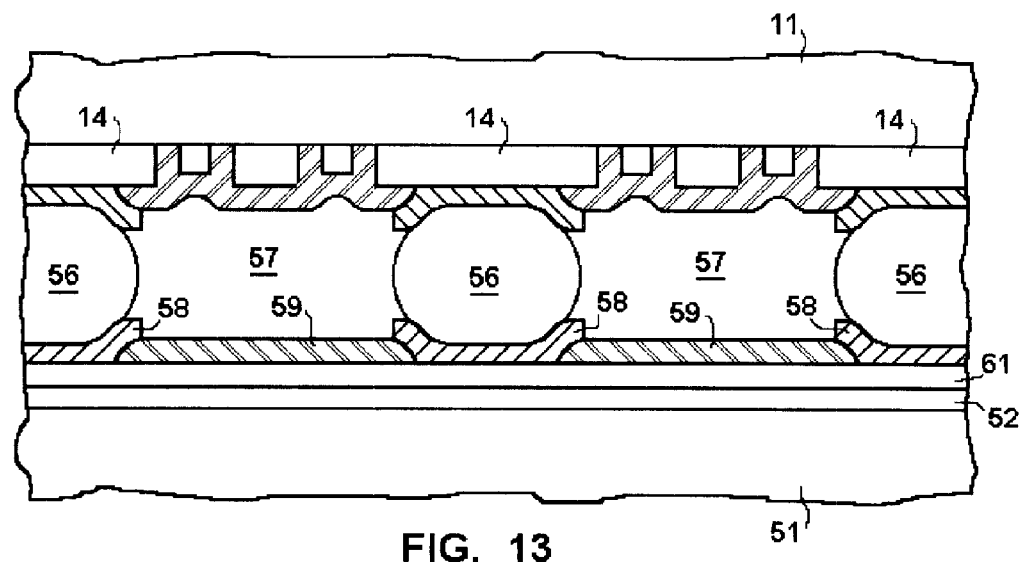

The air isolated crossovers can be seen in more detail in FIG. 13. The air spaces are shown at 57. The under bump metallization on the interconnection substrate, shown at 58, may be deposited on the interconnection runner 61 in the windows of dielectric layer 59 using the technique described above. The runner 61 may be any suitable conductor, but is typically aluminum, to which the UBM described here is adherent. The dielectric 59 is typically $SiO_2$ or a polyimide.

In the foregoing sequence of process steps, the solder bumps are described as being deposited on the transistor chip 11. Alternatively, the solder bumps can be deposited initially on the aluminum windows on the interconnection substrate.

Figure 14:
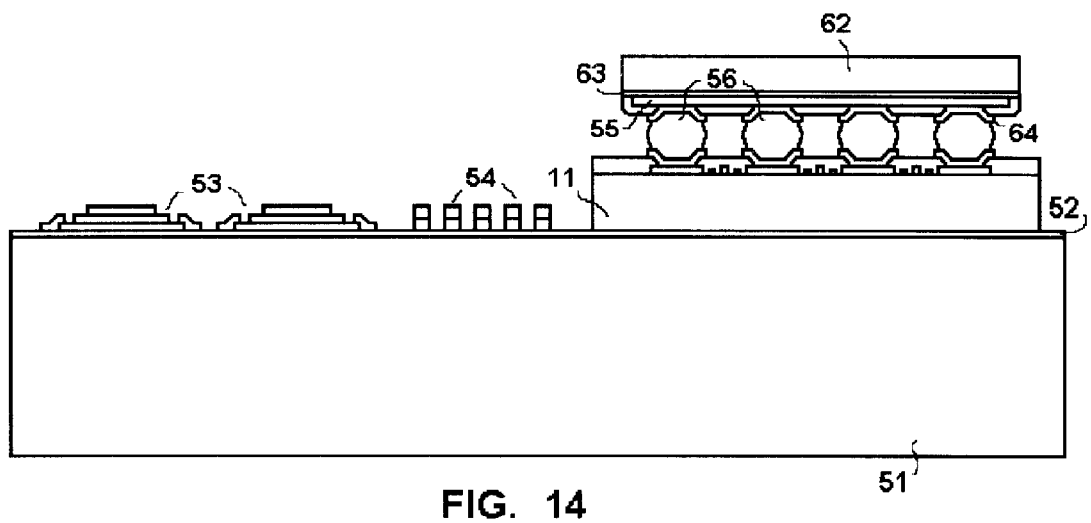

An alternative arrangement using an interconnection substrate flip chip module as a pure crossover interconnection is shown in FIG. 14. Pure crossover interconnection means the interconnection on the interconnection substrate connects to two or more contact sites on the integrated circuit and nothing else, i.e. the interconnection substrate exclusively interconnects those contact sites. In FIG. 14 the active device, e.g. the transistor power chip 11, is mounted on interconnection substrate or printed circuit board 51 in a conventional manner. The flip-chip assembly 62 provides air isolated crossovers for the IC chip 11 via solder bumps 56 and conductive layer 55. The flip-chip assembly 62 preferably comprises a silicon substrate, which gives dimensional control and thermo-mechanical stability to the overall assembly. In this case the interconnection module 62 may simply be a silicon chip with an oxide layer 63, conductive metallization 55, and under bump metallization 64 (optional). As in the embodiment shown in FIG. 13, the solder bumps or balls can be applied initially to either the IC chip 11 or the crossover interconnection substrate 62.

Figure 15:
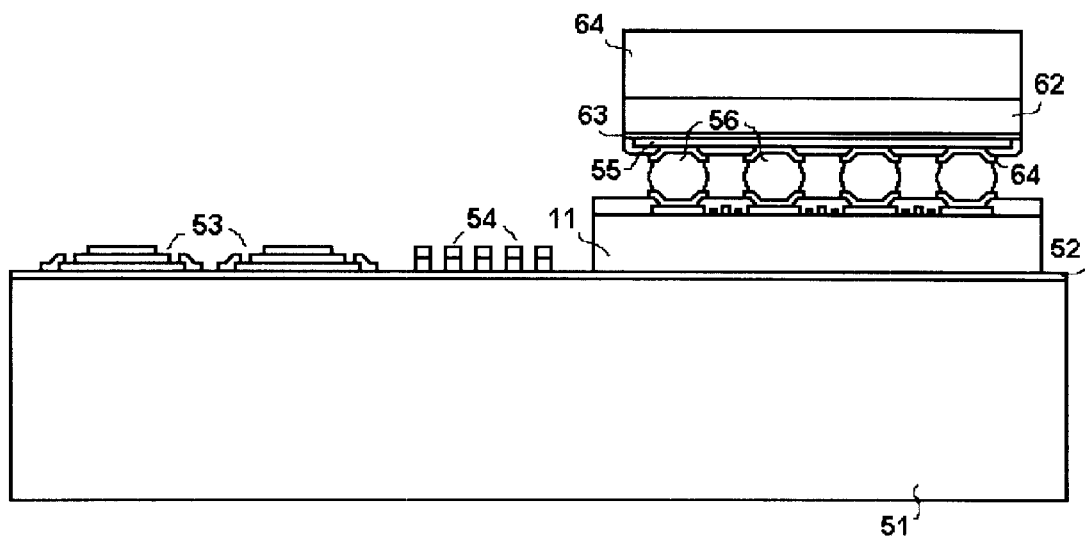

As described in the foregoing, the integrated circuit air isolated crossover of the invention comprises a crossover interconnection substrate as a separate element distinct from the integrated circuit interconnection substrate. The crossover interconnection substrate may be a ceramic substrate or printed circuit assembly, i.e. a printed circuit board which may comprise a standard epoxy or phenolic resin board with metallization on the board, or may be an oxide coated semiconductor, preferably silicon, interconnection substrate with metallization photolithographically formed on the oxide layer. Silicon interconnection substrates offer the additional advantage of providing effective heat sinking from the circuit side of the active chip through the multiplicity of solder bumps. Heat sinking for GaAs power chips for example is often provided on the back side of the chip which is less effective. The heat sinking advantage can be seen in FIG. 15, where heat sink 64 is shown attached to the silicon interconnection substrate 63.

In the invention as described, the crossover interconnections are relatively uncomplicated and a single level of metallization may be sufficient. However, crossover interconnects may be desired in this circuitry as well. Also it is possible that some of the circuitry normally carried by the primary interconnection substrate (e.g. 51 of FIG. 14) may be transferred to the crossover interconnection substrate to reduce the complexity or size of the interconnection circuits on the primary interconnection substrate. In such case the crossover interconnection substrate may also include multilevel circuitry.

In a typical arrangement according to the invention, the integrated circuit with the air isolated crossovers will be part of an overall assembly including multi-chips or multi-components, i.e. passive components, or combinations thereof. As is evident from a comparison of FIGS. 13 and 14, these circuit elements may be part of the primary interconnection substrate or may be part of the crossover interconnection substrate. In the most typical arrangement, both substrates that are flip-chip bonded contain semiconductor chips or passive components, or both.

Various additional modifications of this invention will occur to those skilled in the art. All deviations from the specific teachings of this specification that basically rely on the principles and their equivalents through which the art has been advanced are properly considered within the scope of the invention as described and claimed.

We claim:

1. Integrated circuit device comprising:
   a. an integrated circuit (IC) chip,
   b. a series of IC solder bonding sites on said integrated circuit chip,
   c. at least one integrated circuit device contact located between each of said series of IC solder bonding sites and the next in said series of IC solder bonding sites,
   d. an interconnection substrate (IS) overlying at least said series of IC solder bonding sites, and attached to said integrated circuit chip,
   e. a series of IS solder bonding sites on said interconnection substrate, said IS solder bonding sites aligned with said series of IC solder bonding sites,
   f. a series of solder interconnections between said series of IC solder bonding sites and said series of IS solder bonding sites, and
   g. an electrical connection comprising a printed circuit conductor exclusively interconnecting said series of IS solder bonding sites.

2. The device of claim 1 in which the interconnection substrate comprises a silicon substrate.

3. The device of claim 2 wherein the said series of solder interconnections comprise solder bump interconnections.

4. The device of claim 3 further including under bump metallization between said series of IC solder bonding sites and said solder bumps.

5. The device of claim 4 further including under bump metallization between said series of IS solder bonding sites and said solder bumps.

6. The device of claim 4 in which the under bump metallization is a multilevel metallization comprising at least one layer of copper and at least one layer of chromium.

7. The device of claim 1 wherein the interconnection substrate (IS) is flip-chip bonded to said integrated circuit chip, and said integrated circuit chip is bonded to a second interconnection substrate.

8. The device of claim 2 in which the said silicon substrate has an insulating layer on the silicon substrate, and a conductive metal pattern on said insulating layer, and wherein said conductive metal pattern interconnects said series of IS solder bonding sites.

9. The device of claim 2 further including heat sink means attached to said silicon substrate.

10. Integrated circuit device comprising:
    a. a GaAs power integrated circuit (IC) chip,
    b. a plurality of GaAs power transistors arranged serially on said IC chip, each of said GaAs power transistors having a source contact and a drain contact,
    c. a plurality of IC solder bonding sites with one of said plurality of solder bonding sites connected to each of said drain contacts,
    d. an interconnection substrate (IS) overlying at least said plurality of IC solder bonding sites, and attached to said IC chip,
    e. a plurality of IS solder bonding sites on said interconnection substrate, said IS solder bonding sites aligned with said plurality of IC solder bonding sites,
    f. a series of solder interconnections between said plurality of IC solder bonding sites and said plurality of IS solder bonding sites, and
    g. an electrical connection comprising a printed circuit conductor exclusively interconnecting said plurality of IS solder bonding sites.

\* \* \* \* \*